US005363282A

United States Patent [19]

Hirokazu

[11] Patent Number: 5,363,282

[45] Date of Patent: Nov. 8, 1994

[54] LUMINOUS SIMPLE IN LUMINOUS BODY UNIT AND THE METHOD OF MOUNTING IT

[75] Inventor: Yoshida Hirokazu, Osaka, Japan

[73] Assignee: Teiryo Industry Incorporated, Osaka, Japan

[21] Appl. No.: 974,062

[22] Filed: Nov. 10, 1992

[30] Foreign Application Priority Data

Nov. 11, 1991 [JP] Japan .................................. 3-352581

[51] Int. Cl.[5] .............................................. H05K 7/02

[52] U.S. Cl. .................................... 361/807; 361/748; 361/810; 340/815.47

[58] Field of Search ............... 361/807, 748, 736, 785, 361/787, 810; 362/95, 246; 340/330, 815, 12, 762, 391, 815.15; 248/542

[56] References Cited

U.S. PATENT DOCUMENTS 3,981,139 9/1976 Jackle .................................. 58/23 R
5,039,832 8/1991 Polacek et al. ...................... 200/317
5,179,317 1/1993 Watanable et al. .................. 313/496
5,225,818 7/1993 Lee et al. ........................... 340/711

*Primary Examiner*—Leo P. Picard
*Assistant Examiner*—Young Whang
*Attorney, Agent, or Firm*—Koda and Androlia

[57] ABSTRACT

Method of and construction for mounting a luminous bulb unit in the luminous body unit according to the present invention aims at simplifying the work of mounting a luminous simple to a support plate. By making the electric joining construction and connecting and fixing construction into a single construction, processes of mounting the luminous bulb unit and electric wiring are simplified, with the result of lower manufacturing cost.

6 Claims, 8 Drawing Sheets

LUMINOUS SIMPLE IN LUMINOUS BODY UNIT AND THE METHOD OF MOUNTING IT

BACKGROUND OF THE INVENTION

1. Field of the Invention

This invention relates to an information display system by which a picture display surface is formed by arranging point sources of light in lattice shade (matrix arrangement). More particularly, this invention relates to a luminous body unit composed by arranging luminous simples, each having a plurality of luminous elements (LED, for example), in lattice shape (metric arrangement).

2. Description of the Prior Art

In the case of the luminous body unit of this kind, it is usual that in order to arrange many luminous bulb units in lattice shape luminous simples are connected electrically to a terminal of an attaching base plate through the medium of a plurality of legs or lead wires and are fixed to the attaching base plate through the medium of proper fixing construction, such as checking projections, fixing members, etc. Since the wiring part and the attaching part are of different construction and also in order to make sure of sealability to water, it takes much time and costs higher to attach the luminous bulb units. For example, in the case of lead wire, manufacturing of a large size indicator having scores of thousands of luminous simples will require astronomical wiring work. Moreover, such large size indicator is usually set up outdoors and therefore waterproofing is required, for which sealing by some method is required.

SUMMARY OF THE INVENTION

The first invention of the present application has for its object to simplify the work of mounting the luminous bulb unit to the attaching base plate and the work of electric wiring.

The second invention of the present application has for its object to simplify the construction for mounting the luminous bulb unit to the attaching plate.

The third invention of the present application has for its object to simplify the waterproof construction between the support plate and the luminous bulb unit and also to enhance waterproofing.

BRIEF DESCRIPTION OF THE DRAWING

FIG. 10 shows the second embodiment of the present invention, in which (a) is a front view of the luminous simple, (b) is a side view and (c) is a vertical section, taken along line 10(c)—10(c) in (b).

DETAILED DESCRIPTION OF THE INVENTION

Figure 1:
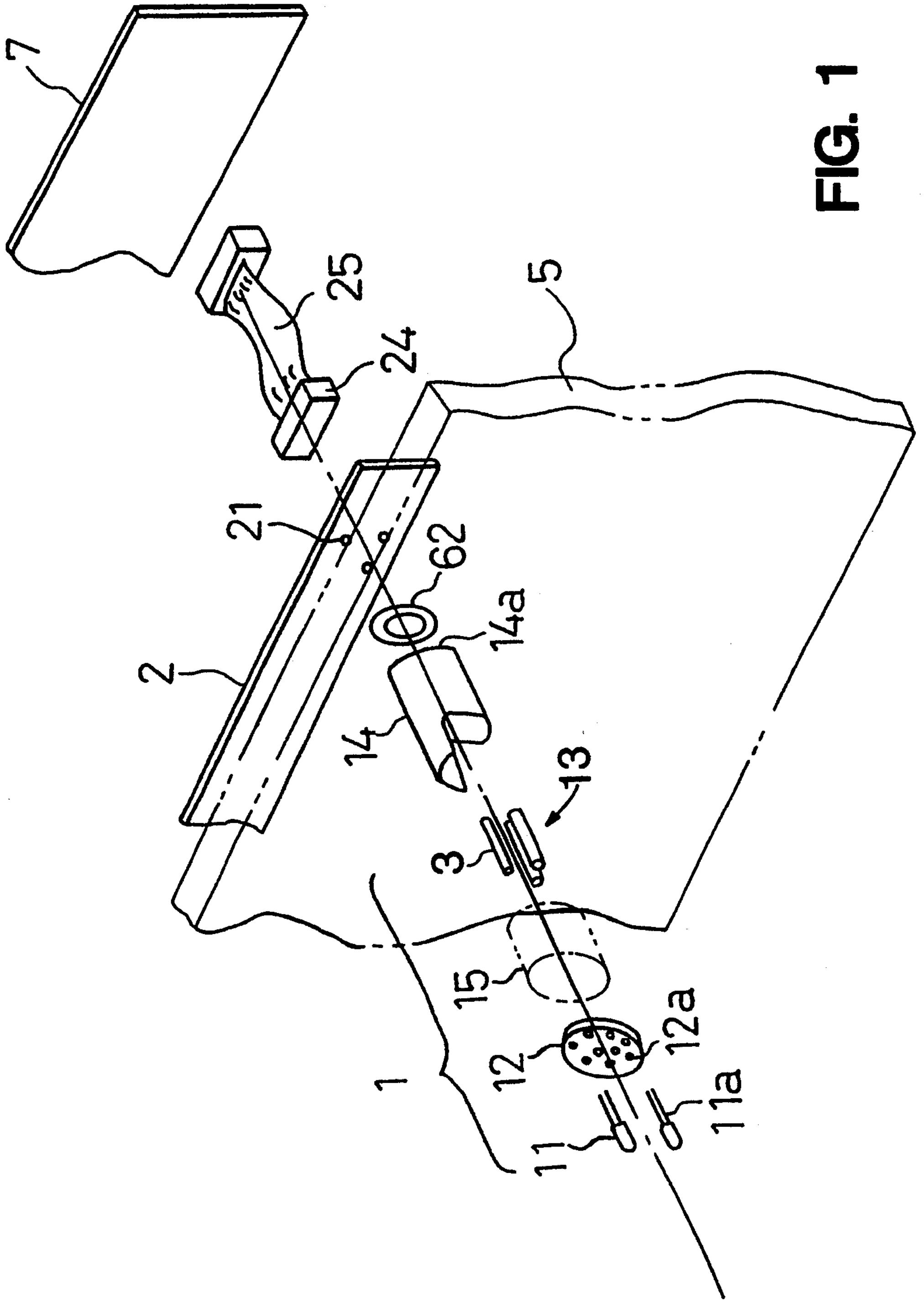
FIG. 1 is a perspective view, showing an embodiment of the construction of the luminous bulb unit in luminous body unit according to the present invention.
Figure 2:
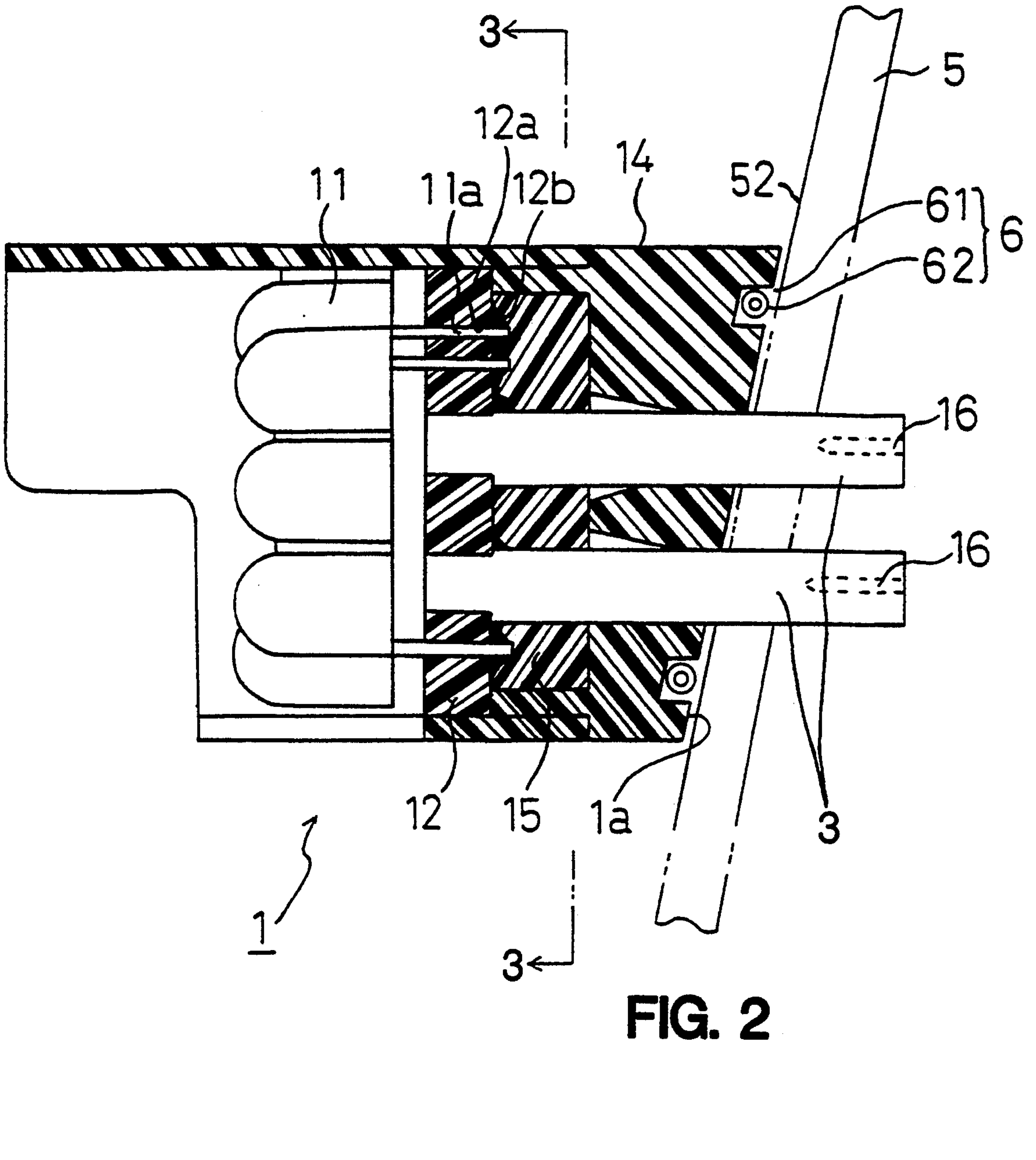
FIG. 2 is a vertical section of the luminous simple.
Figure 3:
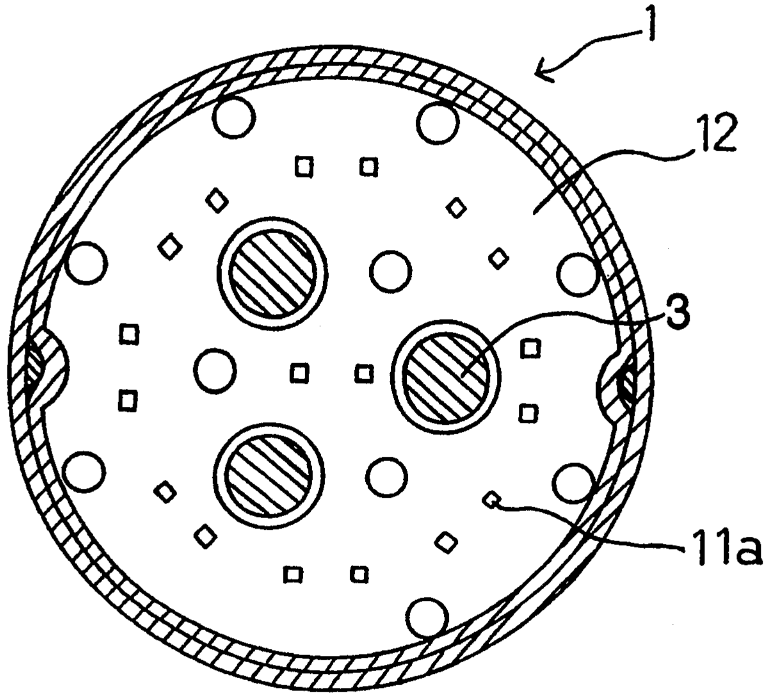
FIG. 3 is a cross section, taken along line 3—3 in FIG. 2.
Figure 4A:
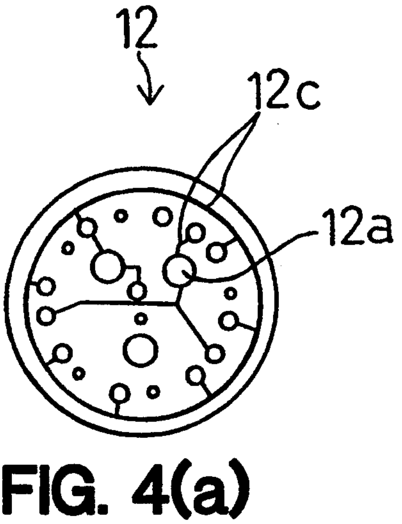
FIG. 4 shows print wiring of the inside base plate of the luminous simple, in which (a) is a surface side and (b) is a back side.
Figure 4B:
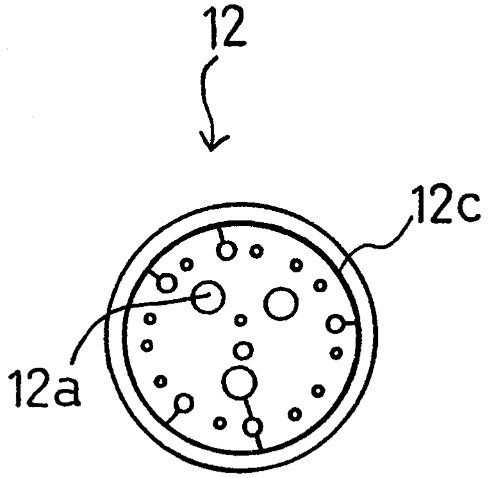

With reference to FIG. 1–FIG. 5, a luminous bulb unit 1 is composed as follows. Terminals 11*a* of a plurality of luminous elements 11 (3 red LED and 6 green LED in the embodiment) are inserted in holes 12*a* of a simple inside base plate 12 and are connected to print wiring 12*c* by soldering 12*b*. Then, by pouring resin 15 into internal space surrounded by a simple case 14, posts 13, the inside base plate 12 and the simple case 14 are united in a body. In the first embodiment, an end portion of the post 13 is projected from an end surface 14*a* (namely, an attaching end surface 1*a* of the luminous bulb unit 1) of the simple case 14 so that the post 13 of the simple case 14 serves as a tubular body 3 which functions as an electrical connecting member and as a connecting and fixing member for attaching the luminous simple to a simple attaching base plate.

As mentioned above, the post 13 (tubular body 3) is incorporated in the luminous bulb unit 1. The post 13 is made of conductive material, such as copper, aluminium, iron or the like, and the number of it is the same as that of the terminal of printed circuit. One end of each post 13 is connected electrically to each terminal by soldering and a screw hole 16 is made at the other end of the post 13.

Figure 6:
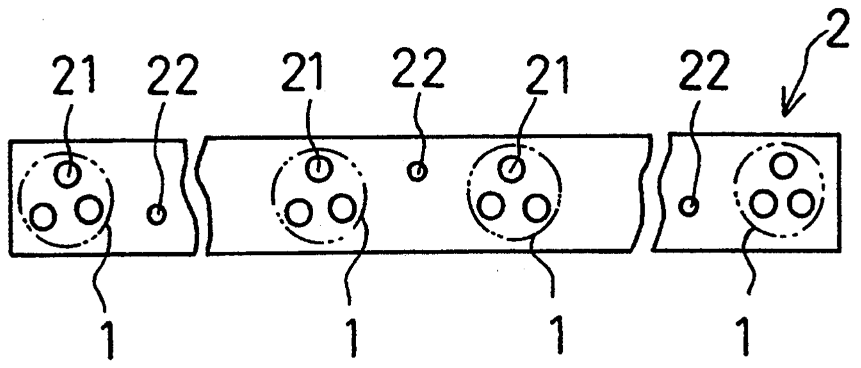
FIG. 6 is a front view, showing the simple attaching plate.

Reference numeral 2 designates a printed circuit board made of insulating material having attaching holes 21, in each of which an end portion of the post 13 (tubular body 3) of the luminous bulb unit 1 is insertable. Referring to FIG. 6, in order to attach a plurality of luminous bulb units 1 (16 pieces in the embodiment) to one printed circuit board 2, three attaching holes 21 are made for attaching one luminous bulb unit 1 (this is one unit) and attaching holes 21 for 16 units are made. In FIG. 6, reference numeral 22 designates an attaching hole for fixing the printed circuit board 2 to the panel 5 by screwing or a through-hole in which a pin projecting from the support plate for locating is inserted.

Figure 7:
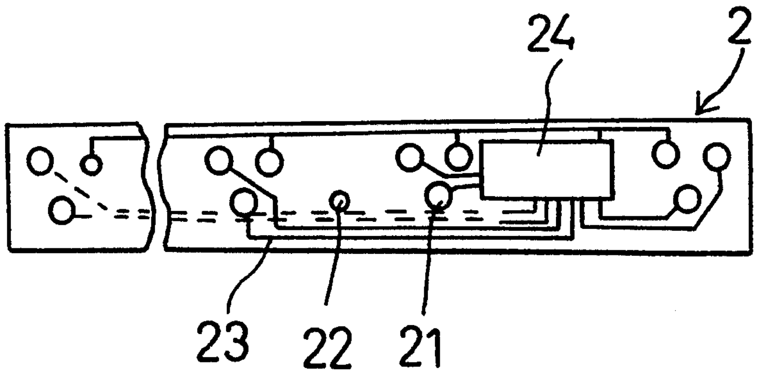
FIG. 7 is a back view of the simple attaching plate and shows print wiring.

Referring to FIG. 7, a terminal unit 24 is arranged at the back side of the printed circuit board 2 for connecting to a driver base plate 7 via a connecting flat cable 25 and a gold plated attaching hole 21 and the terminal unit 24 are connected electrically through the medium of printed circuit 23.

Figure 5:
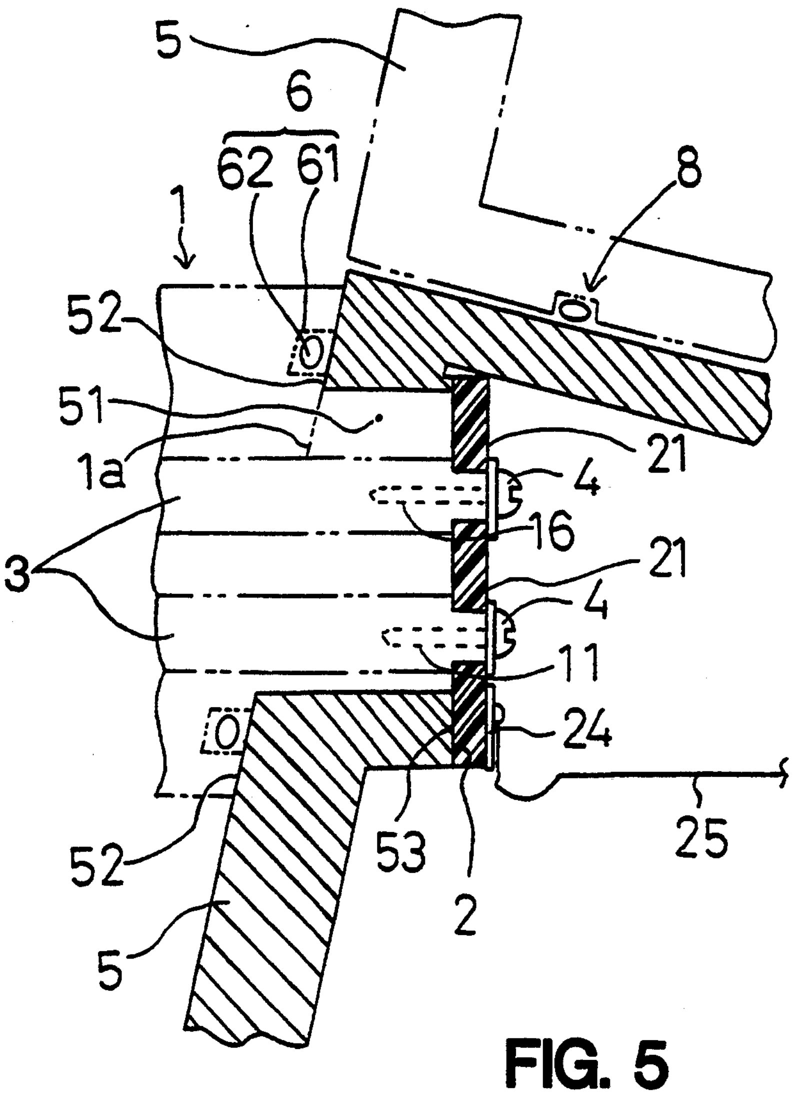
FIG. 5 is a vertical section, showing the simple attaching base plate and support plate.
Figure 13:
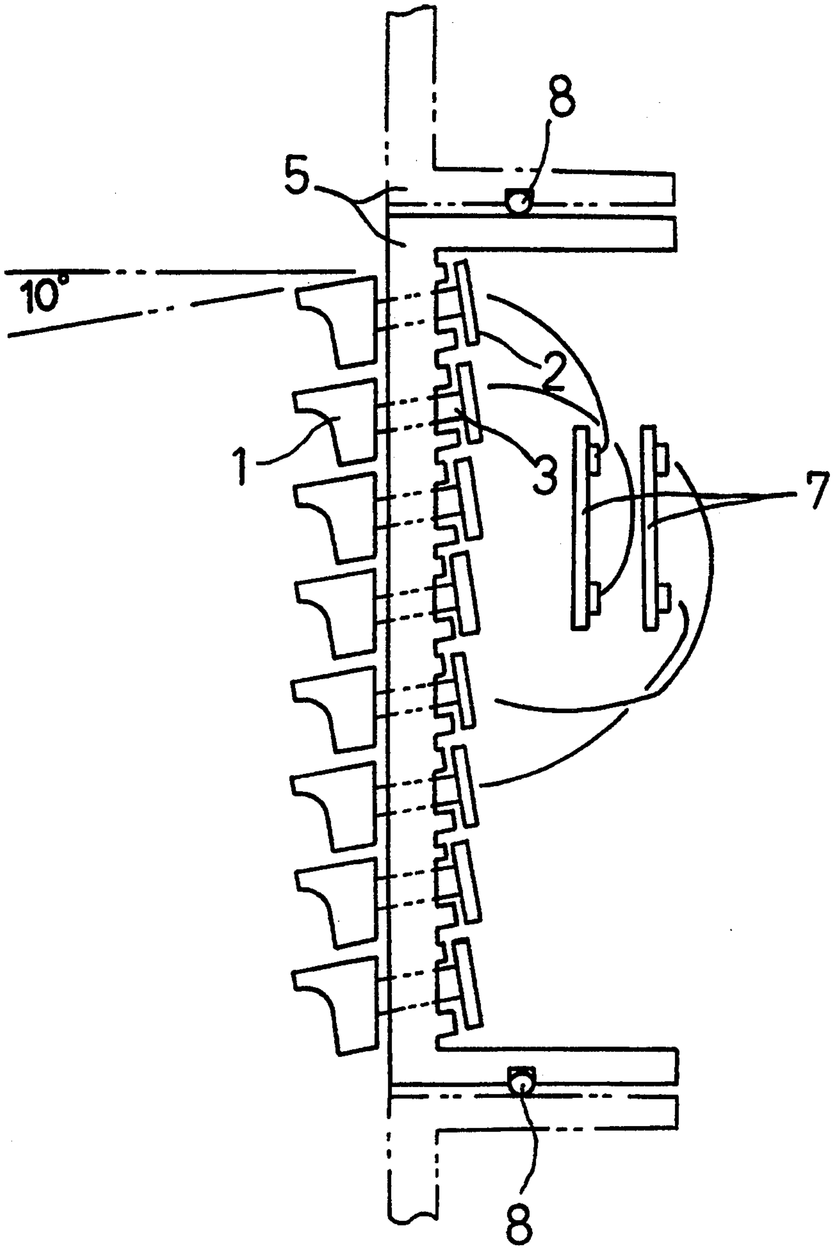
FIG. 13 is a side view of the luminous body unit showin in FIG. 12.

With reference to FIG. 1, FIG. 5 and FIG. 13, the panel 5 supports a plurality (8 pieces, for example) of printed circuit board 2 as one unit. The panel 5 has a window 51 through which the tubular body 3 is passed, a front surface 52 contacting with the attaching end surface la of the luminous simple 1 and a rear surface 53 contacting with the front surface of the printed circuit board 2. Under this arrangement, the panel 5 supports the luminous bulb unit 1 which is in such state that its optical axis has the designated angle of inclination or is horizontal (in the embodiment, the direction of light from the luminous bulb unit 1 is made 10° downward angle of inclination).

A seal construction 6 comprising a groove 61 and a sealing member 62 is provided between the attaching end surface 1*a* of the luminous simple 1 and the front contacting surface 52.

Referring to FIG. 1 and FIG. 5, in manufacturing a luminous body unit, the luminous simple 1 and the tubular body 3 (post 13) are inserted in the window 51 of the panel 5 and the printed circuit board 2 is arranged at an end portion of the tubular body 3. Then, the printed circuit board 2 is located and an end portion of the post 13 (tubular body 3) of the luminous bulb unit 1 is inserted in the attaching hole 21 of the printed circuit board 2 and a screw 4 is screwed into the screw hole 14, whereby the luminous bulb unit 1 is fixed to the printed circuit board 2.

In the above state, printed circuit 23 of the printed circuit board 2 makes tight contact with an end portion of the post 13 (tubular body 3) by screwing of the screw 4, and the printed circuit 23 of the simple attaching base plate 2 and another print wiring 12*c* of the luminous bulb unit 1 are connected electrically to each other through the medium of the post 13 (tubular body 3). Also, while the attaching end surface 1*a* of the luminous bulb unit 1 and the front contact surface 52 of the panel 5 contact each other, the front surface of the printed circuit board 2 and the rear contact surface 53 of the panel 5 contact each other.

Figure 8:
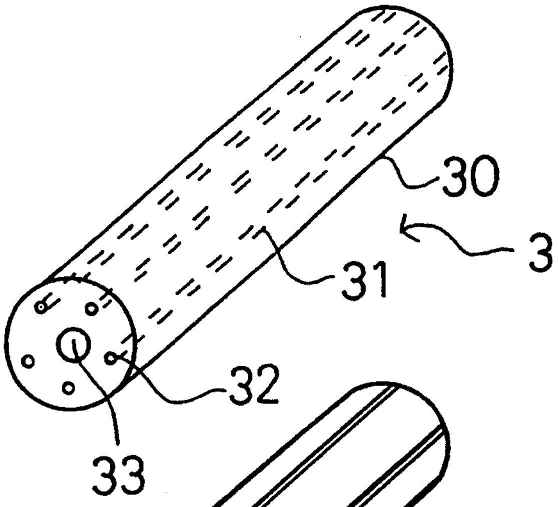
FIG. 8 is a perspective view, showing the tubular body in the second embodiment.

In the second embodiment of the present application shown in FIG. 8, a plurality of through-holes 31 are made in a tubular main body 30 made of insulating material, conductors 32 of wire rod shape made of conductive material, such as copper, aluminium, iron or the like, are inserted in said through-holes 31 and a screw hole 33 is made at the central part of end surface (on the luminous bulb unit 1 side) of the tubular main body 30. Thus, the tubular body 3 is composed.

Figure 9:
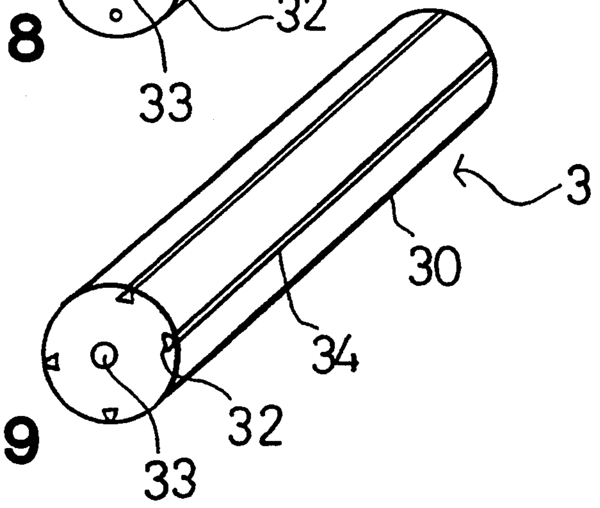
FIG. 9 is a perspective view, showing another embodiment of the tubular body.

In the third embodiment of the present application shown in FIG. 9, a plurality of grooves 34 are made at the peripheral surface of the tubular main body 30, a conductor 52 of wire rod-shape is inserted in each of said grooves 34 and a screw hole 33 is made at the central part of end surface (on the side of the luminous bulb unit 1) of the tubular main body 30. Thus, the tubular body 3 is composed. In this embodiment the groove 34 is made in parallel with the axial center of the tubular main body 30 but the grooves 34 can be arranged in any fashion so far as they are independent to each other, for example, can be arranged in spiral fashion.

Figures 10A, 10B, 10C, 11:
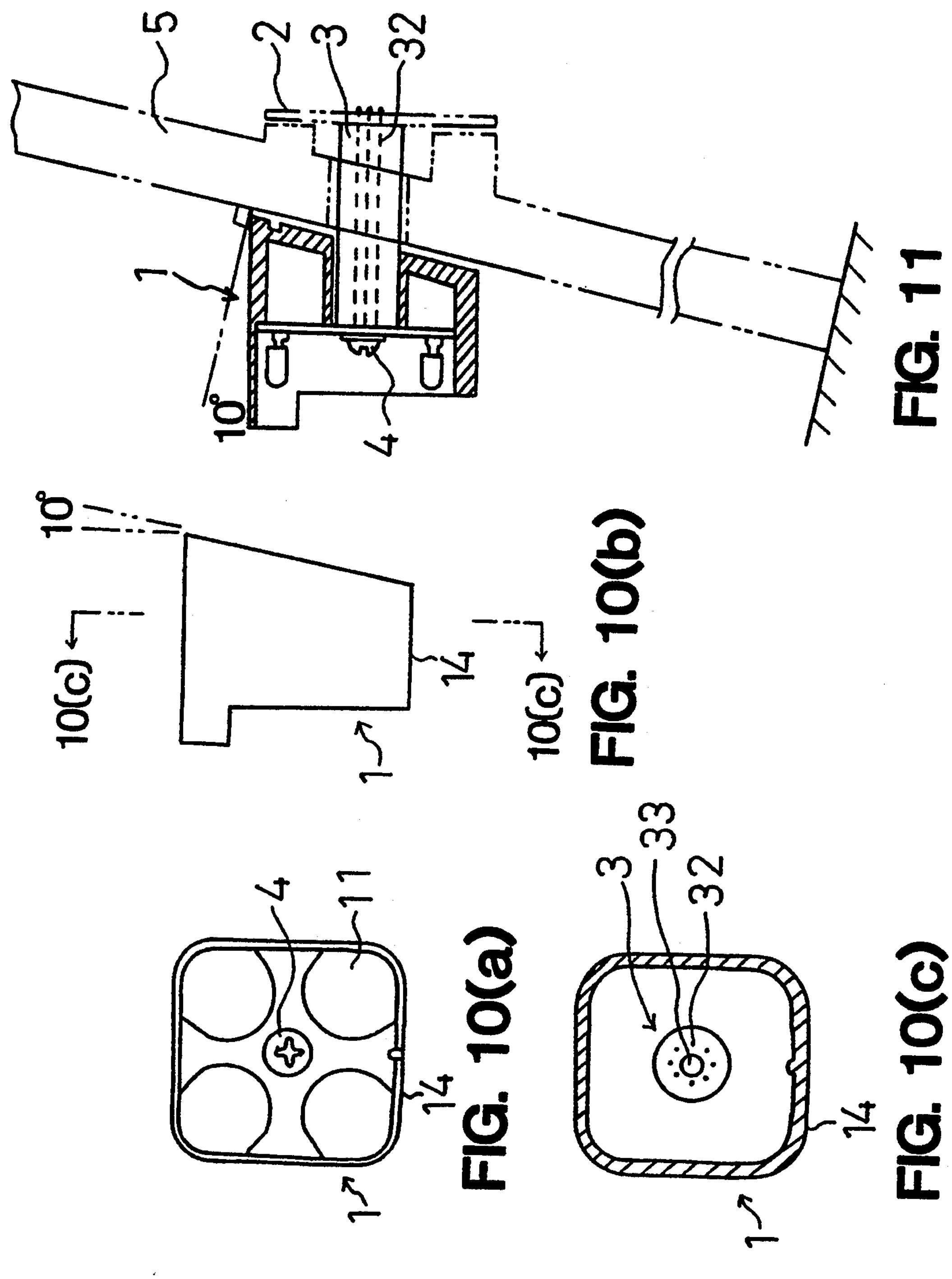
FIG. 11 is a vertical section, showing the state of the luminous simple mounted according to the second embodiment.

In the above second and the third embodiments, the luminous bulb unit 1 is attached to the printed circuit board 2 in the following way. With reference to FIG. 10 and FIG. 11, one end portion of the tubular body 3 of the luminous bulb unit 1 is inserted in the attaching hole 21 of the printed circuit board 2 and an end portion of the conductor 32 of the tubular body 3 is soldered to printed circuit 23 of the printed circuit board 2, whereby the end portion of the tubular body 3 is fixed to the printed circuit board 2 and the conductor 32 of the tubular body 3 is connected electrically to printed circuit of the printed circuit board 2. Then, by screwing the screw 4 into the screw hole 33 (at end surface on the side of the luminous simple) of the tubular body 3, the tubular body 3 is fixed to the luminous bulb unit 1. In this state, by screwing of the screw 4 printed circuit 12*c* of the luminous bulb unit 1 makes tight contact with the end portion of the post 13 (tubular body 3), and printed circuit 23 of the printed circuit board 2 and printed circuit 12*c* of the luminous bulb unit 1 are connected electrically through the medium of the conductor 32 of the tubular body 3.

In the above second and the third embodiments of the present application, the tubular body is fixed to the printed circuit board 2 by soldering but is fixed to the luminous body 1 by screwing. Therefore, in replacing the luminous bulb unit 1, it is only required to unscrew and screw the screw 4 from the side of the luminous bulb unit. This is simpler than in the case of the first embodiment.

Figure 12:
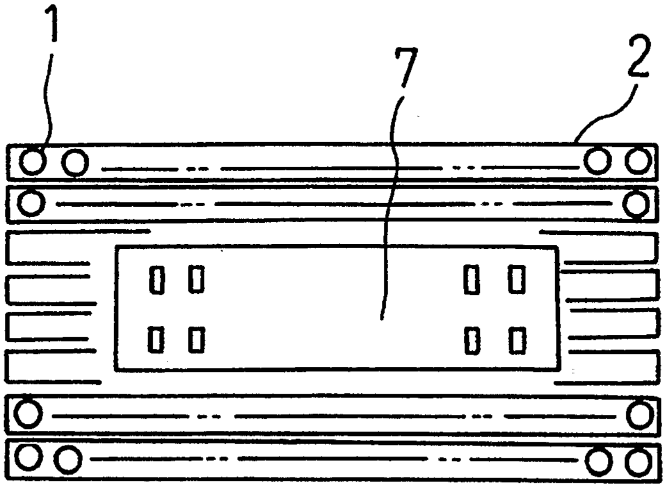
FIG. 12 is a front view of the luminous body unit.

As an unit picture is composed by simples of 16×16 (it is a matter of course that the unit picture can be composed by simples of 8×8, 24×24 and other proper dot composition), the printed circuit board 2 to which 16 pieces of LED simple 1 are attached is arranged in 16 steps but as shown in FIG. 12 and FIG. 13, the unit picture can be composed by two blocks, each having one panel 5 to which the printed circuit board 2 of 8 steps is fitted. One driver base plate 7 is provided for 4 printed circuit board 2 and two driver base plates 7 are arranged for one block.

A plurality of the above unit picture are arranged in vertical direction or horizontal direction or many of them are arranged in lattice-shape and under such arrangements, numerals, "kanji" (Chinese characters) and other visual display are displayed changeably by control by a control device, such as a personal controller, as in the case of the luminous body unit of conventional information display system.

End surface 1*a* of the luminous bulb unit 1 (end surface 14*a* of the simple case 14) is a downward surface of inclination. Therefore, in the state where the luminous bulb unit 1 is attached to the panel 5 as shown in FIG. 13, the luminous bulb unit 1 is in downwardly inclined state but the optional state of inclination or horizontal state can be obtained by selection of the inclination of the end surface 1*a* of the luminous bulb unit 1 or by selection of inclination of the front contact surface of the support plate 5.

In FIG. 5 and FIG. 13, reference numeral 8 designates a seal construction of adjoining support plates. The support plates are connected to each other into one display surface but are detachable in relation to the main case of display apparatus by hinge construction, screwing, etc. It is a matter of course that the tubular body can take polygonal shape.

What is claimed is.

1. A mounting for a luminous bulb unit in a luminous display unit comprising:

a tubular body having a plurality of conductors passing from one end to the other end of the tubular body;

a plurality of luminous body bulb units having a plurality of luminous elements and a printed circuit for electrically connecting said luminous elements;

a support plate for mounting a plurality of luminous bulb units through which said tubular body passes;

a plurality of printed circuit boards having a printed circuit for electrically connecting a plurality of said luminous body bulb units; and wherein said luminous bulb units and said printed circuit boards are mounted to said support plate by said tubular body and electrically connected by said conductors of said tubular body.

2. The mounting for the luminous bulb in the luminous display unit as defined in claim 1, wherein:

said tubular body is soldered into said printed circuit of the luminous body bulb unit at one end; and said support plate is provided between the luminous body bulb unit and the printed circuit board through a medium of the tubular body and fixed to the printed circuit board by screwing a screw means through the printed circuit board.

3. The mounting for a luminous bulb in the luminous display unit as defined in claim 1, wherein:

said tubular body is soldered to said printed circuit of the printed circuit board at one end; and said support plate is provided between the luminous body bulb unit and the printed circuit board through the medium of the tubular body and is fixed to the luminous body bulb unit by screwing a screw means through the luminous body bulb unit.

4. A method of mounting a luminous bulb unit in a luminous display unit comprising the processes of:

fixing one end of a tubular body to a luminous bulb unit by soldering an end portion of a conductor at one end of the tubular body to a circuit of said luminous bulb unit;

putting a support plate between the luminous bulb unit and the printed circuit board through a medium of the tubular body by passing the tubular body through the support plate and locating the luminous bulb unit outside the support plate and locating a printed circuit board inside the support plate; and screwing and fixing the other end of the tubular body to the printed circuit board which is not fixed to the end of the tubular body;

whereby the printed circuit board, the tubular body, the luminous bulb unit and one end portion of the conductor of the tubular body is electrically connected by soldering and the other end of the conductor of the tubular body is fixed by screwing so that the other end of the conductor is pressure connected to the circuit.

5. The method of mounting the luminous bulb unit in the luminous display unit as defined in claim 4, further comprising:

fixing one end of a tubular body to a luminous bulb unit by soldering an end portion of a conductor at one end of the tubular body into the circuit of the luminous bulb unit; and screwing and fixing the other end of the tubular body to the print circuit board with a screw means in a state where an end portion of the conductor is pressure connected to the print circuit board.

6. The method of mounting the luminous bulb unit in the luminous display unit as defined in claim 4, comprising:

fixing one end of a tubular body to the print circuit board by soldering an end portion of a conductor at one end of the tubular body to the print circuit board; and screwing and fixing the other end of the tubular body to the luminous bulb unit with a screw means in a state wherein an end portion of the conductor is pressure connected to a circuit of the luminous bulb unit.

* * * * *